(12) United States Patent
Woo et al.

(10) Patent No.: US 11,522,034 B2
(45) Date of Patent: Dec. 6, 2022

(54) DISPLAY DEVICE HAVING OVERLAPPED CONDUCTING LAYERS WITH HOLES IN PERIPHERAL AREA AND METHOD OF MANUFACTURING THE SAME

(71) Applicant: Samsung Display Co., Ltd., Yongin-si (KR)

(72) Inventors: Min Woo Woo, Seoul (KR); Moo-Soon Ko, Seoul (KR); Wangwoo Lee, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 242 days.

(21) Appl. No.: 16/889,531

(22) Filed: Jun. 1, 2020

(65) Prior Publication Data
US 2021/0020726 A1 Jan. 21, 2021

(30) Foreign Application Priority Data
Jul. 15, 2019 (KR) .......................... 10-2019-0085097

(51) Int. Cl.
*H01L 27/32* (2006.01)

(52) U.S. Cl.
CPC ...... *H01L 27/3276* (2013.01); *H01L 27/3258* (2013.01); *H01L 2227/323* (2013.01); *H01L 2251/5392* (2013.01)

(58) Field of Classification Search
CPC ............ H01L 27/3276; H01L 27/3258; H01L 2227/323; H01L 2251/5392
See application file for complete search history.

(56) References Cited

U.S. PATENT DOCUMENTS

| | | | |
|---|---|---|---|
| 2005/0046346 A1* | 3/2005 | Tsuchiya ............ | H01L 27/3276 313/503 |
| 2005/0218396 A1* | 10/2005 | Tsuchiya ............ | H01L 51/5234 257/13 |
| 2015/0311472 A1* | 10/2015 | Hong ................. | H01L 27/1259 438/158 |
| 2016/0111677 A1* | 4/2016 | Hong ................. | H01L 51/5246 257/40 |
| 2016/0196775 A1* | 7/2016 | Park ..................... | G09G 3/20 345/211 |
| 2016/0343974 A1* | 11/2016 | Jang .................... | H01L 51/5246 |
| 2018/0158407 A1 | 6/2018 | Chai et al. | |

* cited by examiner

*Primary Examiner* — Lex H Malsawma
(74) *Attorney, Agent, or Firm* — Lewis Roca Rothgerber Christie LLP

(57) ABSTRACT

A display device includes: a substrate including a display area and a peripheral area; a first conductive layer on the substrate in the peripheral area; an insulation layer covering the first conductive layer; and a second conductive layer on the insulation layer in the peripheral area, the second conductive layer including a plurality of first holes, wherein the first conductive layer does not overlap the first holes of the second conductive layer.

20 Claims, 9 Drawing Sheets

DISPLAY DEVICE HAVING OVERLAPPED CONDUCTING LAYERS WITH HOLES IN PERIPHERAL AREA AND METHOD OF MANUFACTURING THE SAME

CROSS-REFERENCE TO RELATED APPLICATION

This application claims priority to and the benefit of Korean Patent Application No. 10-2019-0085097 filed on Jul. 15, 2019 in the Korean Intellectual Property Office (KIPO), the entire disclosure of which is incorporated by reference herein.

BACKGROUND

1. Field

Aspects of some example embodiments relate to a display device.

2. Description of the Related Art

Representative examples of flat panel display devices include a liquid crystal display, a plasma display panel, an organic light emitting diode display device, a field effect display, an electrophoretic display device, or the like. The organic light emitting diode display device includes two electrodes and an organic light emitting layer located therebetween. In the organic light emitting layer, electrons injected from one electrode and holes injected from the other electrode are combined to form excitons, and the excitons emit light through energy emission. The organic light emitting diode display device has self-luminance characteristics and does not need a separate light source unlike that of the liquid crystal display, so that the thickness and weight thereof can be reduced compared with that of the liquid crystal display. Furthermore, the organic light emitting diode display device attracts attention as a next-generation display device because of high-grade characteristics of low power consumption, high brightness, and high response speed.

The organic light emitting diode display device may include an insulation layer located on elements such as a transistor, a capacitor, etc. to protect the elements and including an organic insulation material. Gas may be generated in the insulation layer due to short-term or long-term chemical decomposition of the insulation layer including the organic material. The gas may be injected into the organic light emitting layer, and may induce damage such as dark spots, pixel shrinkage, etc.

To release the gas that may induce the damage from the insulation layer, a plurality of holes may be formed in a conductive layer that is located on the insulation layer. However, when forming the holes in the conductive layer, the insulation layer may also be etched so that holes may be formed in the insulation layer, and a conductive layer located under the insulation layer and a conductive layer located over the insulation layer may be short-circuited through the holes of the insulation layer.

The above information disclosed in this Background section is only for enhancement of understanding of the background and therefore the information discussed in this Background section does not necessarily constitute prior art.

SUMMARY

Aspects of some example embodiments relate to a display device. For example, some example embodiments relate to a display device that includes a conductive layer having a plurality of holes and a method of manufacturing the display device.

Some example embodiments provide a display device in which a short-circuit between the conductive lines through holes may be prevented or reduced.

Some example embodiments provide a method of manufacturing a display device for preventing or reducing instances of a short-circuit between the conductive lines through holes.

A display device according to some example embodiments may include a substrate including a display area and a peripheral area, a first conductive layer on the substrate in the peripheral area, an insulation layer covering the first conductive layer, and a second conductive layer on the insulation layer in the peripheral area, the second conductive layer including a plurality of first holes. The first conductive layer may not overlap the first holes of the second conductive layer.

According to some example embodiments, the display device may further include a third conductive layer on the second conductive layer in the peripheral area, the third conductive layer including a plurality of second holes respectively corresponding to the first holes.

According to some example embodiments, a width of each of the second holes may be less than a width of each of the first holes.

According to some example embodiments, the third conductive layer may cover a sidewall of the second conductive layer.

According to some example embodiments, the insulation layer may include a plurality of recessed portions respectively corresponding to the first holes.

According to some example embodiments, a width of each of the recessed portions may be substantially equal to a width of each of the first holes.

According to some example embodiments, a width of each of the second holes may be less than a width of each of the recessed portions.

According to some example embodiments, an end portion of the third conductive layer may be located in each of the recessed portions.

According to some example embodiments, the insulation layer may include an organic insulation material.

According to some example embodiments, the display device may further include a scan driver on the substrate in the peripheral area, the scan driver transmitting a scan signal including a first scan voltage and a second scan voltage less than the first scan voltage to the display area. The first conductive layer may transmit the first scan voltage.

According to some example embodiments, the display device may further include an organic light emitting diode on the substrate in the display area, the organic light emitting diode including a pixel electrode, an emission layer, and an opposite electrode, The second conductive layer may be electrically connected to the opposite electrode.

A method of manufacturing a display device according to some example embodiments may include forming a first conductive layer on a substrate in a peripheral area, forming an insulation layer covering the first conductive layer, forming a second conductive layer on the insulation layer in the peripheral area, and forming a plurality of first holes in the second conductive layer, the first holes not overlapping the first conductive layer.

According to some example embodiments, the method may further include forming a third conductive layer on the second conductive layer in the peripheral area, the third conductive layer including a plurality of second holes respectively corresponding to the first holes.

According to some example embodiments, a width of each of the second holes may be less than a width of each of the first holes.

According to some example embodiments, the third conductive layer may cover a sidewall of the second conductive layer.

According to some example embodiments, the insulation layer may include a plurality of recessed portions respectively corresponding to the first holes.

According to some example embodiments, the recessed portions may be substantially simultaneously formed with the first holes.

According to some example embodiments, a width of each of the second holes may be less than a width of each of the recessed portions.

According to some example embodiments, an end portion of the third conductive layer may be located in each of the recessed portions.

According to some example embodiments, the insulation layer may include an organic insulation material.

In the display device according to some example embodiments, the first conductive layer may not overlap the first holes of the second conductive layer, so that the third conductive layer may not be short-circuited with the first conductive layer although the third conductive layer extends to under the second conductive layer with covering the sidewall of the second conductive layer.

In the method of manufacturing the display device according to some example embodiments, the first holes may be formed in the second conductive layer not to overlap the first conductive layer, so that the third conductive layer may not be short-circuited with the first conductive layer although the third conductive layer is formed inside the first holes.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, display devices and methods of manufacturing display devices in accordance with embodiments will be explained in detail with reference to the accompanying drawings.

Figure 1:
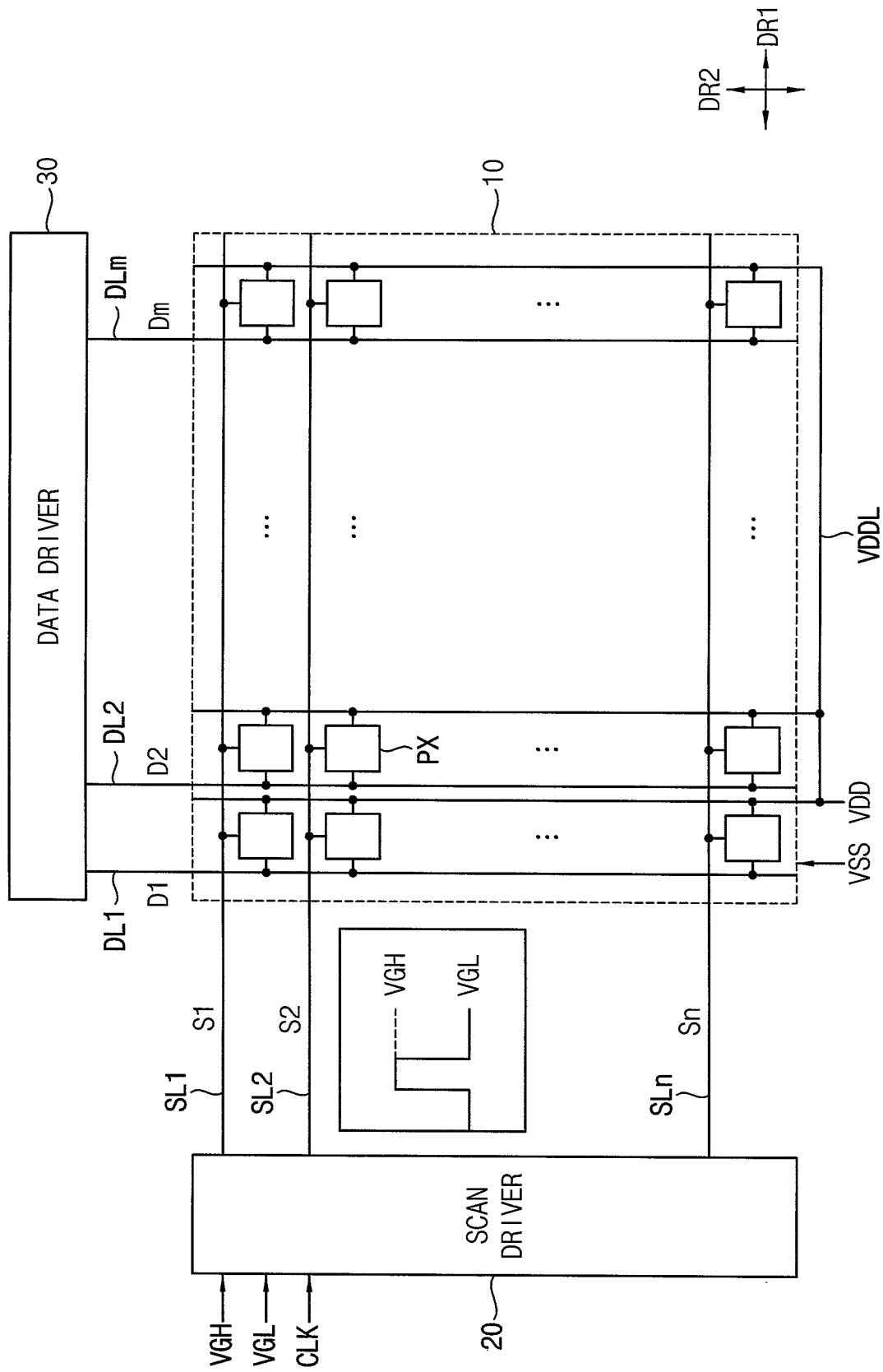
FIG. 1 is a block diagram illustrating a display device according to some example embodiments.

FIG. 1 is a block diagram illustrating a display device according to some example embodiments.

Referring to FIG. 1, a display device according to some example embodiments may include a display unit 10, a scan driver 20, and a data driver 30.

The display unit 10 may include a plurality of pixels PX located at intersections between a plurality of scan lines SL1~SLn and a plurality of data lines DL1~DLm and arranged as a substantial matrix form. The scan lines SL1~SLn may extend along a first direction DR1 that is a row direction, and the data lines DL1~DLm may extend along a second direction DR2 that is a column direction.

The scan driver 20 may be connected to end portions of the scan lines SL1~SLn, and may transmit scan signals S1~Sn to the scan lines SL1~SLn. Each of the pixels PX may be connected to one of the scan lines SL1~SLn, and the scan signals S1~Sn may be transmitted to the pixels PX through the scan lines SL1~SLn.

A first scan voltage VGH, a second scan voltage VGL, and a clock signal CLK may be transmitted to the scan driver 20 from external circuits, and the scan driver 20 may generate the scan signal S1~Sn based on the first scan voltage VGH, the second scan voltage VGL, and the clock signal CLK. The second scan voltage VGL may be less than the first scan voltage VGH. For example, the first scan voltage VGH may be a high level voltage (e.g., a set or predetermined high level voltage), and the second scan voltage VGL may be a low level voltage (e.g., a set or predetermined low level voltage) or a grounded voltage. Each of the scan signals S1~Sn may include the first scan voltage VGH and the second scan voltage VGL.

The data driver 30 may be connected to end portions of the data lines DL1~DLm, and may transmit data signals D1~Dm to the data lines DL1~DLm. Each of the pixels PX may be connected to one of the data lines DL1~DLm, and the data signals D1~Dm may be transmitted to the pixels PX through the data lines DL1~DLm.

A first pixel voltage VDD and a second pixel voltage VSS may be transmitted to each of the pixels PX from external power sources. The second pixel voltage VSS may be less than the first pixel voltage VDD. For example, the first pixel voltage VDD may be a high level voltage (e.g., a set or predetermined high level voltage), and the second pixel voltage VSS may be a low level voltage (e.g., a set or predetermined low level voltage) or a grounded voltage. The first pixel voltage VDD may be transmitted to the pixels PX through a first pixel voltage line VDDL.

The pixels PX may emit light having a luminance (e.g., a set or predetermined luminance) based on a driving current applied to a display element in response to the data signals D1~Dm transmitted through the data lines DL1~DLm. Hereinafter, a display device including an organic light emitting diode OLED as the display element will be described for convenience of explanation. However, embodiments are not limited thereto, and the embodiments may be applied to various display devices such as a liquid crystal display device, an electrophoretic display device, etc.

Figure 2:
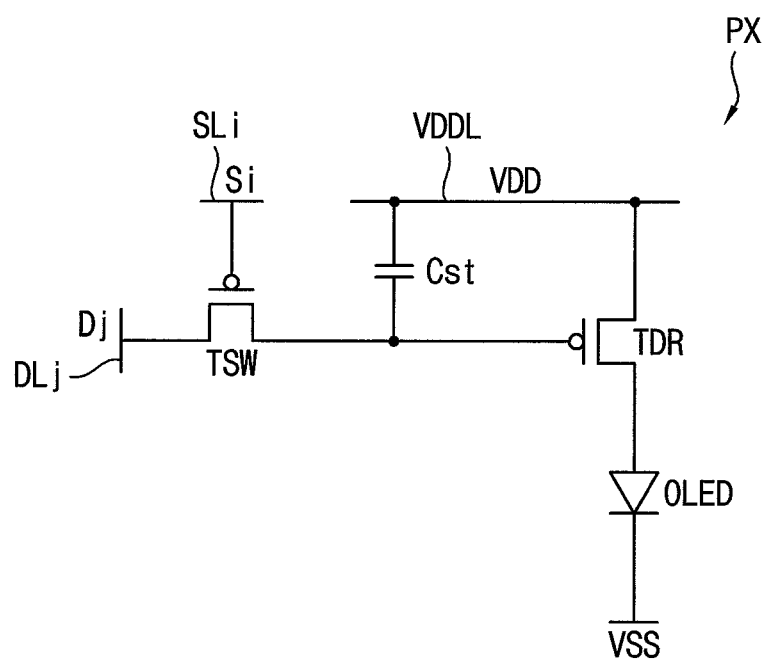
FIG. 2 is a circuit diagram illustrating a pixel of the display device in FIG. 1.

FIG. 2 is a circuit diagram illustrating the pixel PX of the display device in FIG. 1. FIG. 2 may illustrate one pixel PX connected to i-th scan line SLi and j-th data line DLj.

Referring to FIG. 2, a pixel PX according to some example embodiments may include a plurality of transistors TSW and TDR, a storage capacitor Cst, and an organic light emitting diode OLED. The transistors TSW and TDR may include a switching transistor TSW and a driving transistor TDR.

A gate electrode of the switching transistor TSW may be connected to the scan line SLi, and may receive a scan signal Si. A first electrode of the switching transistor TSW may be connected to the data line DLj, and may receive a data signal Dj. A second electrode of the switching transistor TSW may be connected to a first electrode of the storage capacitor Cst and a gate electrode of the driving transistor TDR. The switching transistor TSW may perform a switching operation in which the switching transistor TSW may be turned on in response to the scan signal Si and may transmit the data signal Dj to the gate electrode of the driving transistor TDR.

The gate electrode of the driving transistor TDR may be connected to the second electrode of the switching transistor TSW and the first electrode of the storage capacitor Cst. A first electrode of the driving transistor TDR may be connected to the first pixel voltage line VDDL, and may receive the first pixel voltage VDD. A second electrode of the driving transistor TDR may be connected to an anode of the organic light emitting diode OLED. The driving transistor TDR may receive the data signal Dj according to the switching operation, and may supply a driving current to the organic light emitting diode OLED.

The first electrode of the storage capacitor Cst may be connected to the second electrode of the switching transistor TSW and the gate electrode of the driving transistor TDR. A second electrode of the storage capacitor Cst may be connected to the first pixel voltage line VDDL, and may receive the first pixel voltage VDD. The storage capacitor Cst may maintain a voltage between the first pixel voltage line VDDL and the gate electrode of the driving transistor TDR although the switching transistor TSW is turned off.

The anode of the organic light emitting diode OLED may be connected to the second electrode of the driving transistor TDR, and a cathode of the organic light emitting diode OLED may receive the second pixel voltage VSS. The organic light emitting diode OLED may emit light in response to the driving current supplied from the driving transistor TDR.

FIG. 2 illustrates that the pixel PX according to some example embodiments includes two transistors and one capacitor, However, the present disclosure is not limited thereto, and in another embodiment, the pixel PX may include three or more transistors and/or two or more capacitors. For example, the pixel PX may further include a transistor for compensating a threshold voltage of the driving transistor TDR, a transistor for initializing the driving transistor TDR or the organic light emitting diode OLED, or the like.

Figure 3:
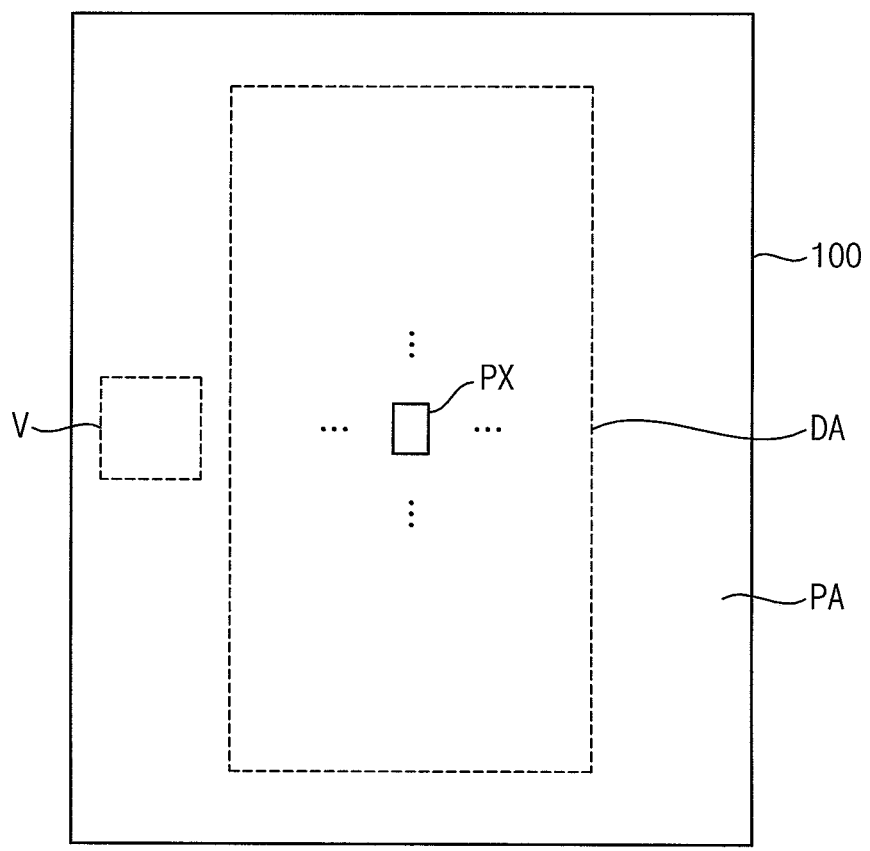
FIG. 3 is a plan view illustrating a display device according to some example embodiments.

FIG. 3 is a plan view illustrating a display device according to some example embodiments.

Referring to FIG. 3, a display device according to some example embodiments may include a substrate 100 including a display area DA and a peripheral area PA. The peripheral area PA may be located outside the display area DA. For example, the peripheral area PA may surround the display area DA. The pixels PX including a display element such as an organic light emitting diode and the scan lines SL1~SLn in FIG. 1, the data lines DL1~DLm in FIG. 1, and the first pixel voltage line VDDL in FIG. 1 which transmit electrical signals to the pixels PX may be located in the display area DA. The scan driver 20 in FIG. 1 and the data driver 30 in FIG. 1 which generate the electrical signals and transmit the electrical signals to the pixels PX may be located in the peripheral area PA.

Figure 4:
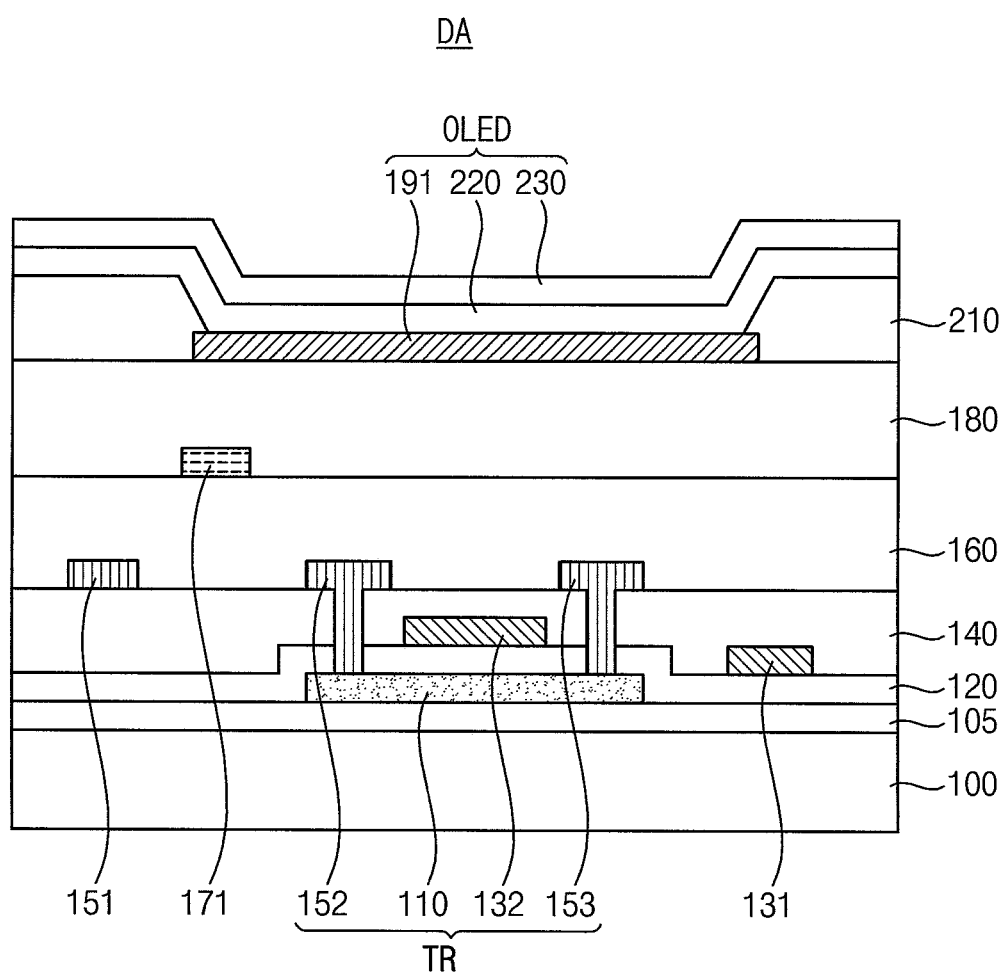
FIG. 4 is a cross-sectional view illustrating a display area of the display device in FIG. 3.

FIG. 4 is a cross-sectional view illustrating the display area DA of the display device in FIG. 3. For example, FIG. 4 may illustrate one pixel PX located in the display area DA.

Referring to FIG. 4, a display device according to some example embodiments may include a transistor TR, lines 131, 151, and 171, and an organic light emitting diode OLED located on the substrate 100 in the display area DA.

The substrate 100 may include glass, metal, or plastic. According to some example embodiments, the substrate 100 may include a material having flexible property or bendable property. When the substrate 100 has the flexible property or the bendable property, the substrate 100 may include polymer resin such as polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate phthalate (CAP), or the like. The substrate 100 may have a single-layer structure or a multi-layer structure including the above materials, and may further include an inorganic layer when having the multi-layer structure. According to some example embodiments, the substrate 100 may have a structure including a first organic layer, an inorganic layer, and a second organic layer which are stacked.

A buffer layer 105 may be located on the substrate 100. The buffer layer 105 may include an inorganic material including an oxide or a nitride. The buffer layer 105 may serve to increase a flatness above the substrate 100, and may include an inorganic material such as silicon oxide, silicon nitride, silicon oxynitride, etc.

A semiconductor layer 110 may be located on the buffer layer 105 in the display area DA. The semiconductor layer 110 may be formed of polycrystalline silicon, amorphous silicon, an oxide semiconductor, etc.

The semiconductor layer 110 may include a channel region, and a source region and a drain region located at respective opposite sides of the channel region. According to some example embodiments, the source region and the drain region may be doped with impurities, and the impurities may include N-type impurities or P-type impurities.

A gate insulation layer 120 may be located on the semiconductor layer 110. The gate insulation layer 120 may include an inorganic material including an oxide or a nitride, or an organic material. For example, the gate insulation layer 120 may include silicon oxide, silicon nitride, silicon oxynitride, aluminum oxide, titanium oxide, tantalum oxide, hafnium oxide, zinc oxide, or the like, and may be formed of a single-layer or a multilayer.

A scan line 131 and a gate electrode 132 may be located on the gate insulation layer 120 in the display area DA. The gate electrode 132 may overlap the channel region of the semiconductor layer 110. The scan line 131 and the gate electrode 132 may be located on the same layer, and may include the same material. For example, the scan line 131 and the gate electrode 132 may include molybdenum (Mo), copper (Cu), titanium (Ti), or the like, and may be formed of a single-layer or a multilayer.

An insulation interlayer 140 may be located on the scan line 131 and the gate electrode 132. The insulation interlayer 140 may include an inorganic material including an oxide or a nitride, or an organic material. For example, the insulation interlayer 140 may include silicon oxide, silicon nitride, silicon oxynitride, aluminum oxide, titanium oxide, tantalum oxide, hafnium oxide, zinc oxide, or the like, and may be formed of a single-layer or a multilayer.

A first line 151, a first electrode 152, and a second electrode 153 may be located on the insulation interlayer 140. The first electrode 152 may be electrically connected to one of the source region and the drain region of the semiconductor layer 110, and the second electrode 153 may be electrically connected to the other of the source region and the drain region of the semiconductor layer 110. The first line 151, the first electrode 152, and the second electrode 153 may be located on the same layer, and may include the same material. For example, the first line 151, the first electrode 152, and the second electrode 153 may include aluminum (Al), copper (Cu), titanium (Ti), or the like, and may be formed of a single-layer or a multilayer.

The semiconductor layer 110, the gate electrode 132, the first electrode 152, and the second electrode 153 may form the transistor TR. The transistor TR illustrated in FIG. 4 may be any one of the switching transistor TSW and the driving transistor TDR which are illustrated in FIG. 2.

A first insulation layer 160 may be located on the first line 151, the first electrode 152, and the second electrode 153. The first insulation layer 160 may include an organic material. For example, the first insulation layer 160 may include acrylate, benzocyclobutene (BCB), polyimide (PI), hexamethyldisiloxane (HMDSO), or the like, and may be formed of a single-layer or a multilayer.

A second line 171 may be located on the first insulation layer 160 in the display area DA. For example, the second line 171 may include aluminum (Al), copper (Cu), titanium (Ti), or the like, and may be formed of a single-layer or a multilayer.

According to some example embodiments, one of the first line 151 and the second line 171 may be the data line DLj in FIG. 2, and the other of the first line 151 and the second line 171 may be the first pixel voltage line VDDL in FIG. 2. However, the present disclosure is not limited thereto, and according to some example embodiments, both the first line 151 and the second line 171 may be the data line.

A second insulation layer 180 may be located on the second line 171. The second insulation layer 180 may include an organic material. For example, the second insulation layer 180 may include acrylate, benzocyclobutene (BCB), polyimide (PI), hexamethyldisiloxane (HMDSO), or the like, and may be formed of a single-layer or a multilayer.

The organic light emitting diode OLED including a pixel electrode 191, an opposite electrode 230, and an intermediate layer 220 interposed between the pixel electrode 191 and the opposite electrode 230 may be located on the second insulation layer 180 in the display area DA. The intermediate layer 220 may include an emission layer.

The pixel electrode 191 may be connected to the second electrode of the driving transistor TDR in FIG. 2 through a contact hole defined in the second insulation layer 180.

A pixel defining layer 210 may be located on the second insulation layer 180. According to some example embodiments, an opening portion corresponding to each pixel, that is, an opening portion exposing a central portion of the pixel electrode 191, may be defined through the pixel defining layer 210 to define a pixel. Further, the pixel defining layer 210 may increase a distance between an edge of the pixel electrode 191 and the opposite electrode 230, thereby effectively preventing or reducing the occurrence of an arc or the like therebetween. For example, the pixel defining layer 210 may include an organic material, such as polyimide (PI), hexamethyldisiloxane (HMDSO), or the like.

The intermediate layer 220 of the organic light emitting diode OLED may include a low molecular material or a polymer material. According to some example embodiments, where the intermediate layer 220 includes the low molecular material, the intermediate layer 220 may have a stack structure including a hole injection layer ("HIL"), a hole transport layer ("HTL"), an emission layer ("EML"), an electron transport layer ("ETL"), and an electron injection layer ("EIL"), each of which may have a single-layer structure or a multilayer structure. The intermediate layer 220 may include at least one of various organic materials, such as copper phthalocyanine (CuPc), N,N'-di(naphthalene-1-yl)-N,N'-diphenyl-benzidine (NPB), tris-8-hydroxyquinoline aluminum (Alq3), or the like.

According to some example embodiments, where the intermediate layer 220 includes the polymer material, the intermediate layer 220 may include an HTL and an EML. In such an embodiment, the HTL may include PEDOT, and the EML may include a polymer such as poly-phenylenevinylene (PPV) and polyfluorene. The intermediate layer 220 may include a common layer over a plurality of pixel electrodes 191, or may include a patterned layer corresponding to each of the pixel electrodes 191.

The opposite electrode 230 may be located on the intermediate layer 220. The opposite electrode 230 may be a common layer covering a plurality of organic light emitting diodes OLED, and may correspond over a plurality of pixel electrodes 191.

According to some example embodiments, the pixel electrode 191 and the opposite electrode 230 may be an anode and a cathode of the organic light emitting diode OLED, respectively. However, the present disclosure is not limited thereto, and according to some example embodiments, the pixel electrode 191 and the opposite electrode 230 may be the cathode and the anode of the organic light emitting diode OLED, respectively.

Figure 5:
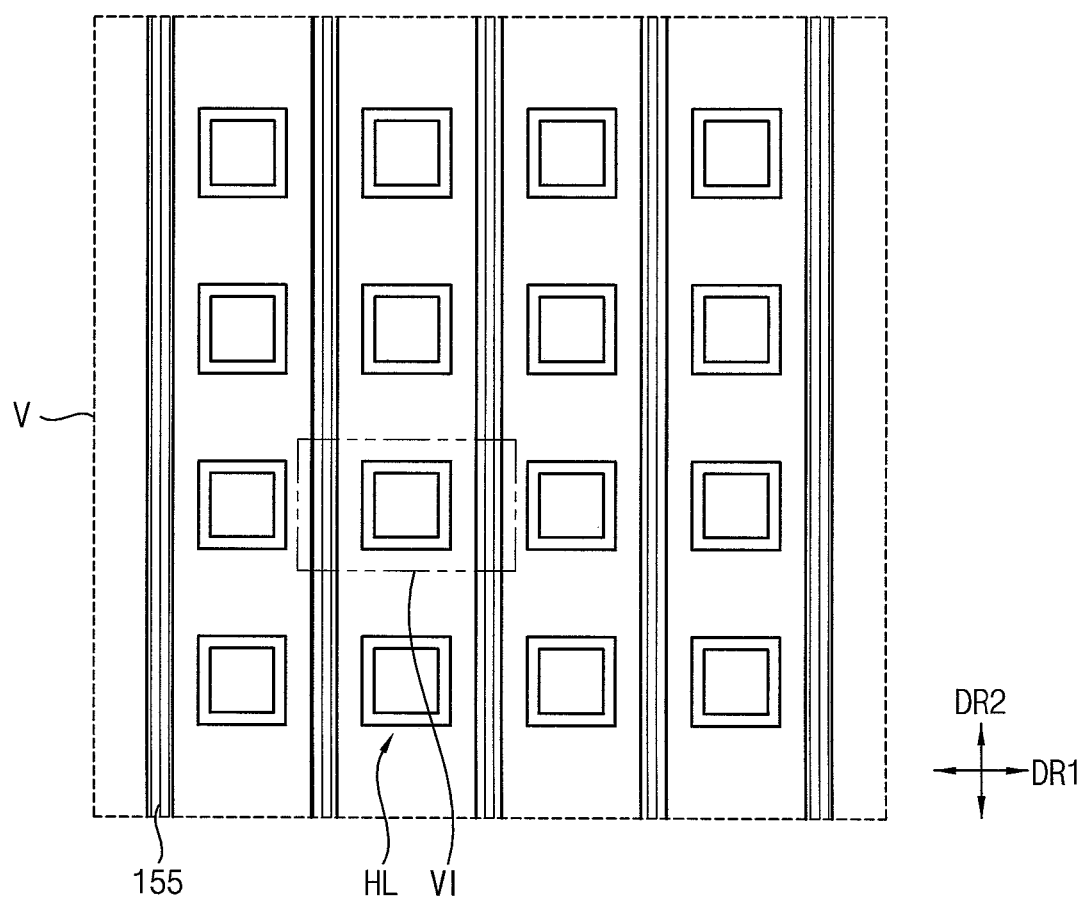
FIG. 5 is a cross-sectional view illustrating a peripheral area of the display device in FIG. 3.
Figure 6:
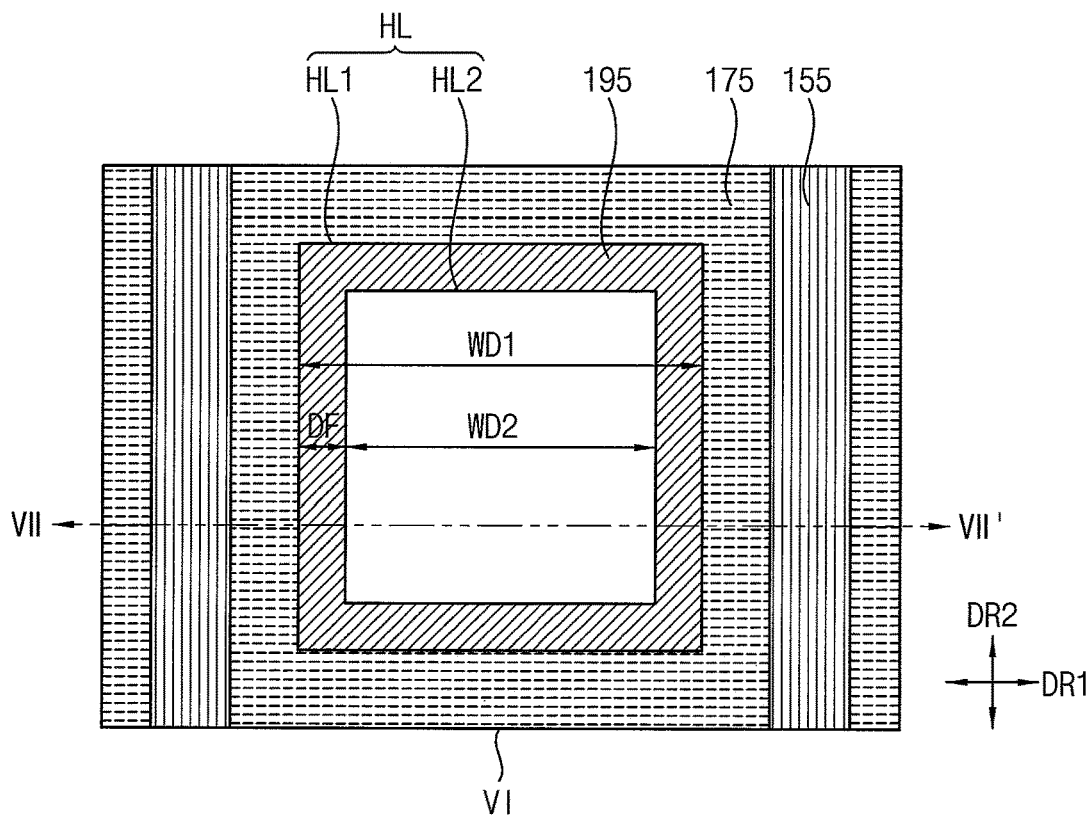
FIG. 6 is a plan view illustrating an area VI in FIG. 5.
Figure 7:
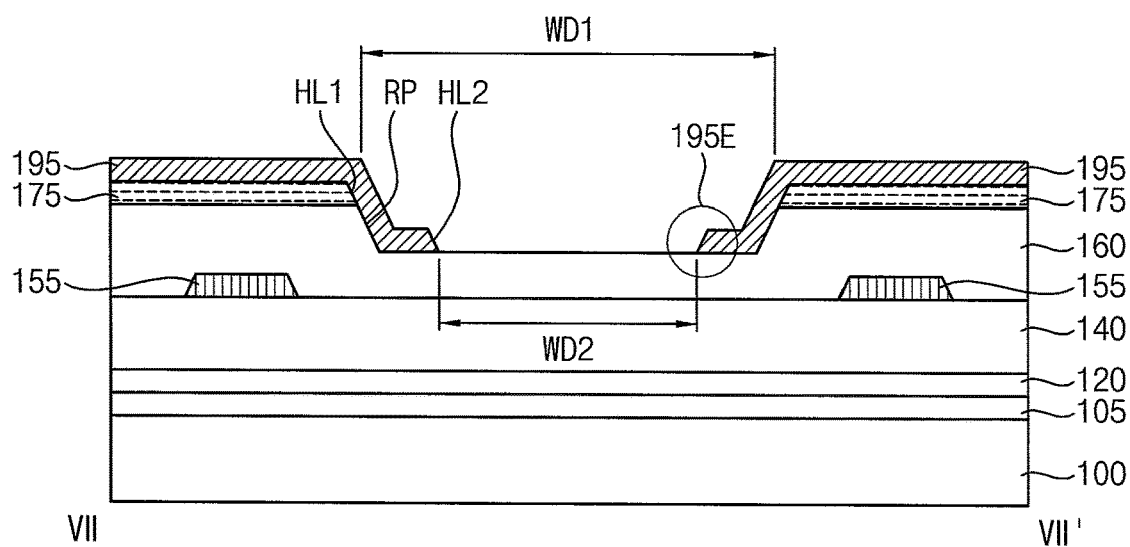
FIG. 7 is a cross-sectional view taken along a line VII-VII' in FIG. 6.

FIG. 5 is a cross-sectional view illustrating the peripheral area PA of the display device in FIG. 3. For example, FIG. 5 may illustrate an area V in FIG. 3. FIG. 6 is a plan view illustrating an area VI in FIG. 5. FIG. 7 is a cross-sectional view taken along a line VII-VII' in FIG. 6.

Referring to FIGS. 5, 6, and 7, a display device according to some example embodiments may include a first conductive layer 155, the first insulation layer 160, a second conductive layer 175, and a third conductive layer 195 which are located on the substrate 100 in the peripheral area PA.

The first conductive layer 155 may be located on the substrate 100 in the peripheral area PA. The buffer layer 105, the gate insulation layer 120, and the insulation interlayer 140 may extend from the display area DA to the peripheral area PA, and the first conductive layer 155 may be located on the insulation interlayer 140. The first conductive layer 155 may be located on the same layer and may include the same material as the first line 151 in FIG. 4, the first electrode 152 in FIG. 4, and the second electrode 153 in FIG. 4.

The first conductive layer 155 may include a plurality of lines. The lines may extend along the second direction DR2.

According to some example embodiments, the first conductive layer 155 may transmit the first scan voltage VGH in FIG. 1. For example, the lines included in the first conductive layer 155 may be connected to the scan driver 20 in FIG. 1, and may transmit the first scan voltage VGH to the scan driver 20. However, the present disclosure is not limited thereto, and according to some example embodiments, the first conductive layer 155 may transmit the second scan voltage VGL in FIG. 1.

The first insulation layer 160 covering the first conductive layer 155 may be located on the insulation interlayer 140. The first insulation layer 160 may extend from the display area DA to the peripheral area PA.

The second conductive layer 175 may be located on the first insulation layer 160 in the peripheral area PA. The second conductive layer 175 may be located on the same layer and may include the same material as the second line 171 in FIG. 4.

According to some example embodiments, the second conductive layer 175 may transmit the second pixel voltage VSS in FIG. 1. The second conductive layer 175 may be electrically connected to the opposite electrode 230 of the organic light emitting diode OLED in FIG. 4 located in the display area DA, and may transmit the second pixel voltage VSS to the opposite electrode 230.

The second conductive layer 175 may include a plurality of first holes HL1. The first holes HL1 may pass through the second conductive layer 175 along a thickness direction of the second conductive layer 175. The first holes HL1 may be arranged along the first direction DR1 and the second direction DR2 as a substantial matrix form. According to some example embodiments, each of the first holes HL1 may have a substantially rectangular shape.

In the first insulation layer 160 located under the second conductive layer 175 and including an organic insulation material, gas may be generated by short-term or long-term chemical decomposition of moisture, or the like. If the gas is not properly released, the organic light emitting diode OLED located in the display area may be degraded thereby pixel shrinkage, reduced lifetime, etc. may be induced. The first holes HL1 may be formed in the second conductive layer 175 so that the gas generated in the first insulation layer 160 may be released through the first holes HL1.

According to some example embodiments, the first insulation layer 160 may include a plurality of recessed portion RP respectively corresponding to the first holes HL1. The recessed portions RP of the first insulation layer 160 may be formed together with the first holes HL1 when the first holes HL1 of the second conductive layer 175 are formed. Accordingly, a width of each of the recessed portions RP may be substantially equal to a width of each of the first holes HL1. Each of the recessed portions RP may have a shape depressed from an upper surface of the first insulation layer 160 toward the substrate 100.

The second insulation layer 180 in FIG. 4 may not extend from the display area DA to the peripheral area PA, and the third conductive layer 195 may be located on the second conductive layer 175. The third conductive layer 195 may be located on the same layer and may include the same material as the pixel electrode 191.

The third conductive layer 195 may include a plurality of second holes HL2 respectively corresponding to the first holes HL1. The second holes HL2 may pass through the third conductive layer 195 along a thickness direction of the third conductive layer 195. The second holes HL2 may be arranged along the first direction DR1 and the second direction DR2 as a substantial matrix form. According to some example embodiments, each of the second holes HL2 may have a substantially rectangular shape. The second holes HL2 may form a plurality of holes HL together with the first holes HL1. Each of the holes HL may include the first hole HL1 formed in the second conductive layer 175 and the second hole HL2 formed in the third conductive layer 195. Accordingly, the gas generated in the first insulation layer 160 may be released through the holes HL.

According to some example embodiments, a width WD2 of each of the second holes HL2 may be less than a width WD1 of each of the first holes HL1. In such an embodiment, the third conductive layer 195 may cover a sidewall of the second conductive layer 175 which is exposed by the first holes HL1, and an end portion 195E of the third conductive layer 195 may be located in each of the recessed portions RP of the first insulation layer 160. Accordingly, the width WD2 of each of the second holes HL2 may be less than a width of each of the recessed portions RP. Further, the third conductive layer 195 may covers the sidewall of the second conductive layer 175 and may extend to inside each of the recessed portions PR of the first insulation layer 160, so that the end portion 195E of the third conductive layer 195 may be located under the second conductive layer 175. In other words, a distance from the substrate 100 to the end portion 195E of the third conductive layer 195 may be less than a distance from the substrate 100 to the second conductive layer 175.

According to some example embodiments, each of the first hole HL1 and the second hole HL2 may have a rectangular shape, and the second hole HL2 may be located inside the first hole HL1 in a plan view. In such an embodiment, a planar distance DF from an edge of the first hole HL1 to an edge of the second hole HL2 may be, e.g., about 2 μm. In other words, the edge of the second hole HL2 may be located at a position spaced apart from the edge of the first hole HL1 to inside the first hole HL1 by about 2 μm.

As described above, the recessed portions RP of the first insulation layer 160 may be formed together with the first holes HL1 when the first holes HL1 of the second conductive layer 175 are formed, and the first conductive layer 155 located under the first insulation layer 160 may be exposed by the recessed portion RP of the first insulation layer 160 when a depth of the recessed portion RP of the first insulation layer 160 is a relatively large. When the third conductive layer 195 formed on the second conductive layer 175 is in contact with the first conductive layer 155 exposed by the recessed portion RP of the first insulation layer 160, the third conductive layer 195 may be short-circuited with the first conductive layer 155.

To prevent or reduce instances of a short-circuit between the third conductive layer 195 and the first conductive layer 155, the first conductive layer 155 may not overlap the first holes HL1 of the second conductive layer 175. In other words, the first conductive layer 155 may overlap the second conductive layer 175, and may not located under the first holes HL1 that pass through the second conductive layer 175. The first conductive layer 155 may not overlap the recessed portions RP of the first insulation layer 160 and the second holes HL2 of the third conductive layer 195.

When the first conductive layer 155 does not overlap the first holes HL1 of the second conductive layer 175 and the recessed portions RP of the first insulation layer 160, the first conductive layer 155 may not be exposed by the recessed portion RP of the first insulation layer 160 although the recessed portion RP of the first insulation layer 160 is deeply formed. Accordingly, the short-circuit between the third conductive layer 195 and the first conductive layer 155 by the first holes HL1 of the second conductive layer 175 and the recessed portions RP of the first insulation layer 160 may be prevented.

FIGS. 8, 9, 10, 11, and 12 are cross-sectional views illustrating a method of manufacturing a display device according to some example embodiments.

Figure 8:
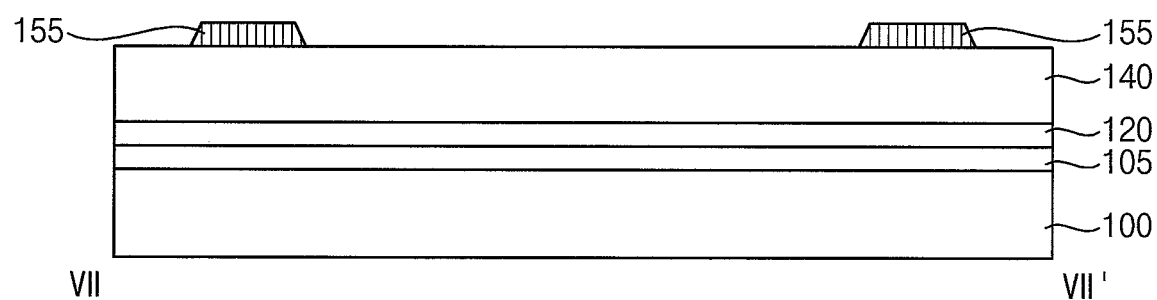
FIGS. 8, 9, 10, 11, and 12 are cross-sectional views illustrating a method of manufacturing a display device according to some example embodiments.

Referring to FIG. 8, the first conductive layer 155 may be formed on the substrate 100 in the peripheral area PA. A conductive material may be deposited on the substrate 100 on which the buffer layer 105, the gate insulation layer 120, and the insulation interlayer 140 are formed and may be patterned to form the first conductive layer 155. The first conductive layer 155 may be substantially simultaneously formed with the same material as the first line 151 in FIG. 4, the first electrode 152 in FIG. 4, and the second electrode 153 in FIG. 4.

Figure 9:
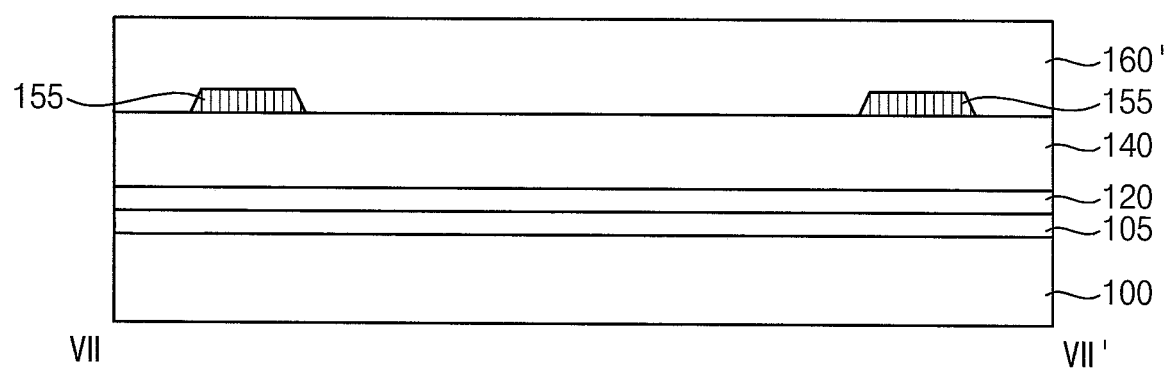

Referring to FIG. 9, a preliminary first insulation layer 160' covering the first conductive layer 155 may be formed.

An organic insulation material may be deposited on the insulation interlayer 140 on which the first conductive layer 155 is formed to form the preliminary first insulation layer 160'. The preliminary first insulation layer 160' may be formed in the peripheral area PA and the display area.

Figure 10:
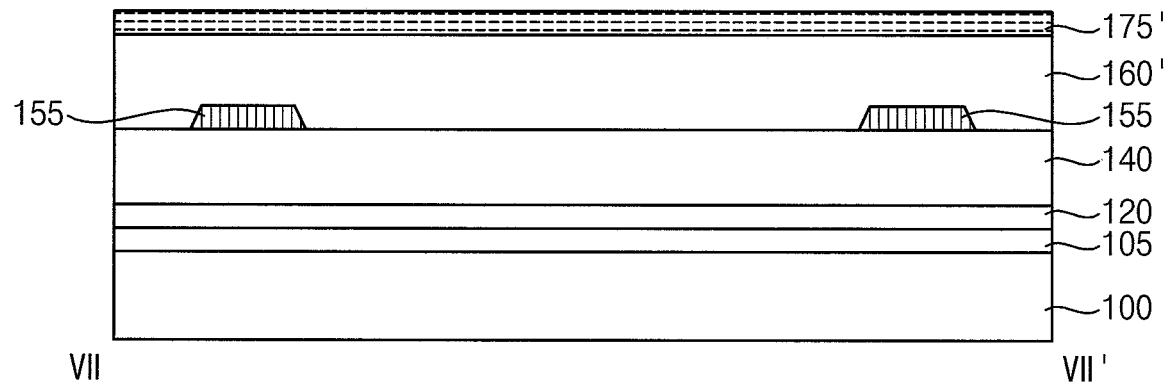

Referring to FIG. 10, a preliminary second conductive layer 175' may be formed on the preliminary first insulation layer 160' in the peripheral area PA. A conductive material may be deposited on the preliminary first insulation layer 160' covering the first conductive layer 155 to form the preliminary second conductive layer 175'.

Figure 11:
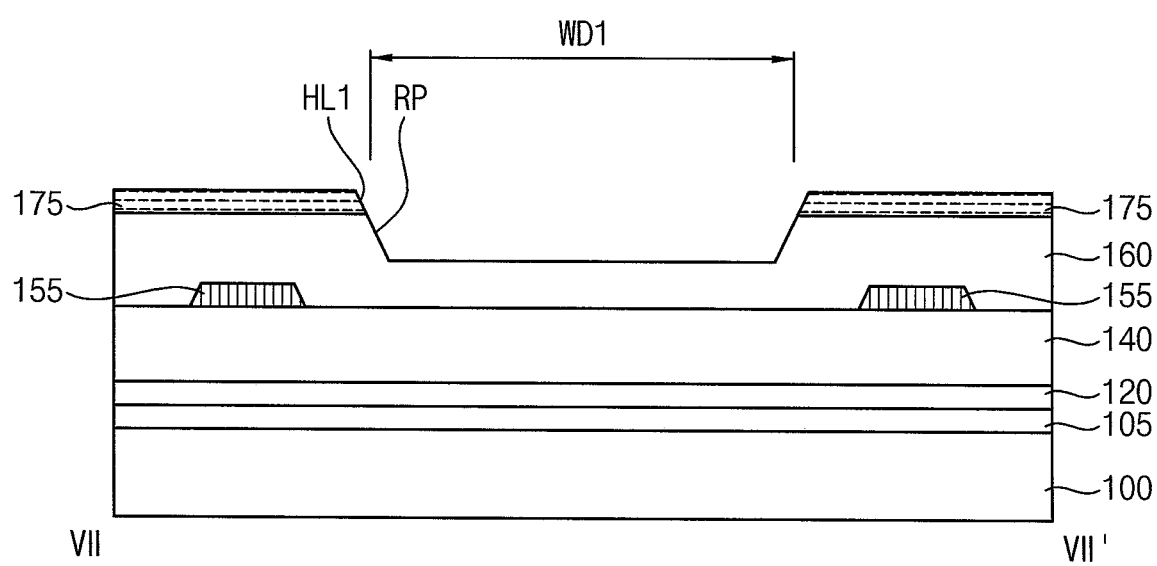

Referring to FIG. 11, the first holes HL1 may be formed in the preliminary second conductive layer 175'. For example, the preliminary second conductive layer 175' may be patterned by a dry etching to form the first holes HL1. The first holes HL1 may not overlap the first conductive layer 155. Accordingly, the second conductive layer 175 including the first holes HL1 which are not overlap the first conductive layer 155 may be formed. The second conductive layer 175 may be substantially simultaneously formed with the same material as the second line 171 in FIG. 4.

According to some example embodiments, the recessed portions RP respectively corresponding to the first holes HL1 may be formed in the preliminary first insulation layer 160'. When the preliminary second conductive layer 175' is etched to form the first holes HL1, a portion of the preliminary first insulation layer 160' may be etched together with the preliminary second conductive layer 175'. For example, the recessed portions RP may be substantially simultaneously formed with the first holes HL1, and a width of each of the recessed portions RP may be substantially equal to a width WD1 of each of the first holes HL1. Accordingly, the first insulation layer 160 including the recessed portions RP respectively corresponding to the first holes HL1 and not overlapping the first conductive layer 155 may be formed.

Figure 12:
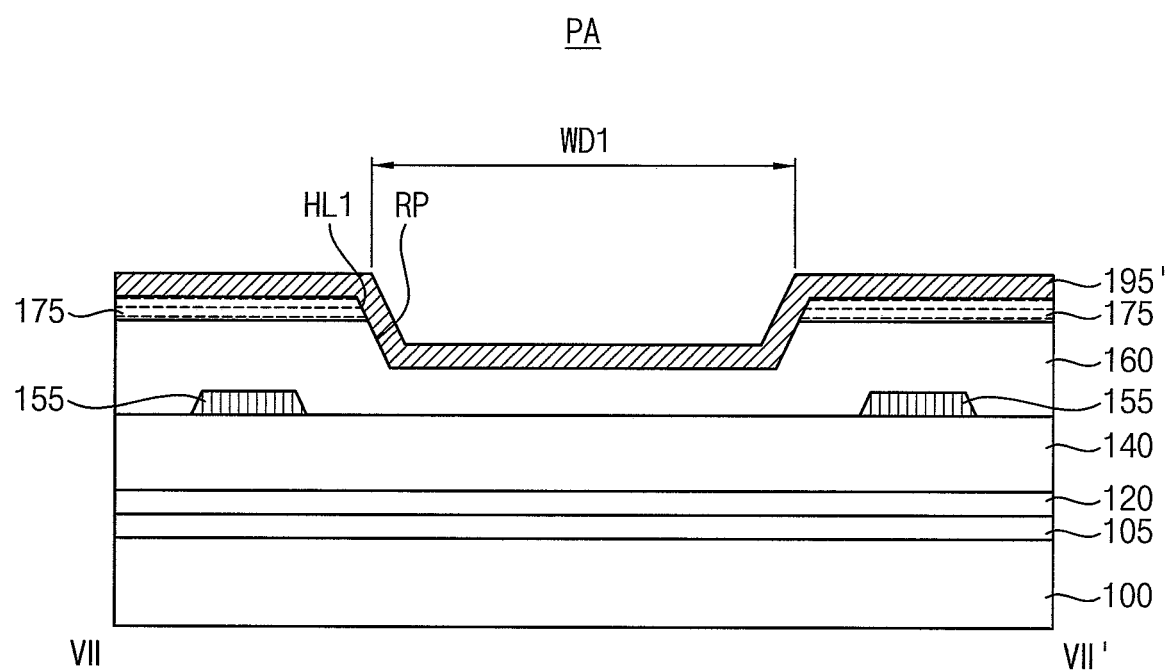

Referring to FIG. 12, a preliminary third conductive layer 195' may be formed on the second conductive layer 175 in the peripheral area PA. A conductive material may be deposited on the second conductive layer 175 including the first holes HL1 and the first insulation layer 160 including the recessed portions RP to form the preliminary third conductive layer 195' covering an upper surface and a sidewall of the second conductive layer 175 and the recessed portions RP of the first insulation layer 160. The preliminary third conductive layer 195' may be formed along a profile of the upper surface and the sidewall of the second conductive layer 175 and the recessed portions RP of the first insulation layer 160.

Referring to FIG. 7, the second holes HL2 may be formed in the preliminary third conductive layer 195'. The second holes HL2 may respectively correspond to the first holes HL1. Specifically, the second holes HL2 may be respectively formed inside the recessed portions RP of the first insulation layer 160. Accordingly, a width WD2 of each of the second holes HL2 may be less than a width of each of the recessed portions RP. Further, because the width of each of the recessed portions RP is substantially equal to the width WD1 of each of the first holes HL1, the width WD2 of each of the second holes HL2 may be less than the width WD1 of each of the first holes HL1. Accordingly, the third conductive layer 195 including the second holes HL2 respectively corresponding to the first holes HL1 and covering the sidewall of the second conductive layer 175 may be formed. The third conductive layer 195 may be substantially simultaneously formed with the same material as the pixel electrode 191 in FIG. 4. Further, an end portion 195E of the third conductive layer 195 may be located inside each of the recessed portions RP.

The display device according to the embodiments may be applied to a display device included in a computer, a notebook, a mobile phone, a smartphone, a smart pad, a PMP, a PDA, an MP3 player, or the like.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

Although the display device and the method of manufacturing the display device according to the embodiments have been described with reference to the drawings, the illustrated embodiments are examples, and may be modified and changed by a person having ordinary knowledge in the relevant technical field without departing from the technical spirit described in the following claims, and their equivalents.

What is claimed is:

1. A display device, comprising:
    a substrate including a display area and a peripheral area;
    a first conductive layer on the substrate in the peripheral area, the first conductive layer including a plurality of lines spaced apart from each other in a first direction and extending along a second direction crossing the first direction;
    an insulation layer covering the first conductive layer; and
    a second conductive layer on the insulation layer in the peripheral area, the second conductive layer including a plurality of first holes having a closed shape surrounded by the second conductive layer and arranged in a matrix of rows and columns,
    wherein the first conductive layer does not overlap the first holes of the second conductive layer.

2. The display device of claim 1, further comprising:
    a third conductive layer on the second conductive layer in the peripheral area, the third conductive layer including a plurality of second holes respectively corresponding to the first holes and having a closed shape surrounded by the third conductive layer and arranged in a matrix of rows and columns.

3. The display device of claim 2, wherein a width of each of the second holes is less than a width of each of the first holes.

4. The display device of claim 2, wherein the third conductive layer covers a sidewall of the second conductive layer.

5. The display device of claim 2, wherein the insulation layer includes a plurality of recessed portions respectively corresponding to the first holes.

6. The display device of claim 5, wherein a width of each of the recessed portions is equal to a width of each of the first holes.

7. The display device of claim 5, wherein a width of each of the second holes is less than a width of each of the recessed portions.

8. The display device of claim 5, wherein an end portion of the third conductive layer is in each of the recessed portions.

9. The display device of claim 1, wherein the insulation layer includes an organic insulation material.

10. The display device of claim 1, further comprising a scan driver on the substrate in the peripheral area, the scan driver being configured to transmit a scan signal including a first scan voltage and a second scan voltage less than the first scan voltage to the display area,
wherein the first conductive layer is configured to transmit the first scan voltage.

11. The display device of claim 1, further comprising an organic light emitting diode on the substrate in the display area, the organic light emitting diode including a pixel electrode, an emission layer, and an opposite electrode,
wherein the second conductive layer is electrically connected to the opposite electrode.

12. A method of manufacturing a display device, the method comprising:

forming a first conductive layer on a substrate in a peripheral area, the first conductive layer including a plurality of lines spaced apart from each other in a first direction and extending along a second direction crossing the first direction;

forming an insulation layer covering the first conductive layer;

forming a second conductive layer on the insulation layer in the peripheral area; and forming a plurality of first holes in the second conductive layer, the first holes not overlapping the first conductive layer and having a closed shape surrounded by the second conductive layer and arranged in a matrix of rows and columns.

13. The method of claim 12, further comprising:

forming a third conductive layer on the second conductive layer in the peripheral area, the third conductive layer including a plurality of second holes respectively corresponding to the first holes and having a closed shape surrounded by the third conductive layer and arranged in a matrix of rows and columns.

14. The method of claim 13, wherein a width of each of the second holes is less than a width of each of the first holes.

15. The method of claim 13, wherein the third conductive layer covers a sidewall of the second conductive layer.

16. The method of claim 13, wherein the insulation layer includes a plurality of recessed portions respectively corresponding to the first holes.

17. The method of claim 16, wherein the recessed portions are simultaneously formed with the first holes.

18. The method of claim 16, wherein a width of each of the second holes is less than a width of each of the recessed portions.

19. The method of claim 16, wherein an end portion of the third conductive layer is in each of the recessed portions.

20. The method of claim 12, wherein the insulation layer includes an organic insulation material.

* * * * *